United States Patent
Park et al.

(10) Patent No.: US 7,714,817 B2
(45) Date of Patent: May 11, 2010

(54) ORGANIC LIGHT EMITTING DIODE DISPLAY

(75) Inventors: Kwon Shik Park, Seoul (KR); Soo Young Yoon, Goyang-Si (KR); Min Doo Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 986 days.

(21) Appl. No.: 11/476,662

(22) Filed: Jun. 29, 2006

(65) Prior Publication Data

US 2007/0001937 A1 Jan. 4, 2007

(30) Foreign Application Priority Data

Jun. 30, 2005 (KR) ............. 10-2005-0058029

(51) Int. Cl.
*G09G 3/32* (2006.01)
(52) U.S. Cl. .......................... 345/82; 345/76
(58) Field of Classification Search .......... 345/82, 345/83, 76, 211–213; 315/169.1, 169.3; 313/309, 336

See application file for complete search history.

(56) References Cited

U.S. PATENT DOCUMENTS

| | | | |
|---|---|---|---|
| 6,194,837 B1 | 2/2001 | Ozawa | |
| 6,380,689 B1 | 4/2002 | Okuda | |
| 6,690,367 B2 | 2/2004 | Akimoto | |
| 6,771,028 B1 | 8/2004 | Winters | |
| 7,259,737 B2 | 8/2007 | Ono et al. | |
| 2002/0186183 A1 | 12/2002 | Akimoto | |
| 2004/0108979 A1 | 6/2004 | Seki | |
| 2004/0252089 A1 | 12/2004 | Ono et al. | |
| 2005/0062691 A1 | 3/2005 | Tamura et al. | |
| 2007/0008268 A1* | 1/2007 | Park et al. ............ | 345/92 |

FOREIGN PATENT DOCUMENTS

| | | |
|---|---|---|
| CN | 1499470 | 5/2004 |
| CN | 1551079 | 12/2004 |
| JP | 11-24604 A | 1/1999 |
| JP | 2000-235370 A | 8/2000 |
| JP | 2001-52864 A | 2/2001 |
| JP | 2001-109432 A | 4/2001 |
| JP | 2002-50484 A | 2/2002 |
| JP | 2002-366076 A | 12/2002 |
| JP | 2004-151501 A | 5/2004 |
| JP | 2004-341359 A | 12/2004 |

* cited by examiner

*Primary Examiner*—Ricardo L Osorio
(74) *Attorney, Agent, or Firm*—Birch, Stewart, Kolasch & Birch LLP

(57) ABSTRACT

An organic light emitting diode (OLED) display device for reducing the number of lines of an organic light emitting diode panel is provided. The OLED display device includes first and second data lines; a power voltage supply line supplied with a power supply voltage; a gate line crossing the first data line, the second data line and the power voltage supply line; first and second organic light emitting diodes commonly connected to the power voltage supply line; a first organic light emitting diode driving circuit for driving the first organic light emitting diode with a data voltage from the first data line in response to a scanning signal from the gate line; and a second organic light emitting diode driving circuit for driving the second organic light emitting diode with a data voltage from the second data line in response to the scanning signal from the gate line.

25 Claims, 13 Drawing Sheets

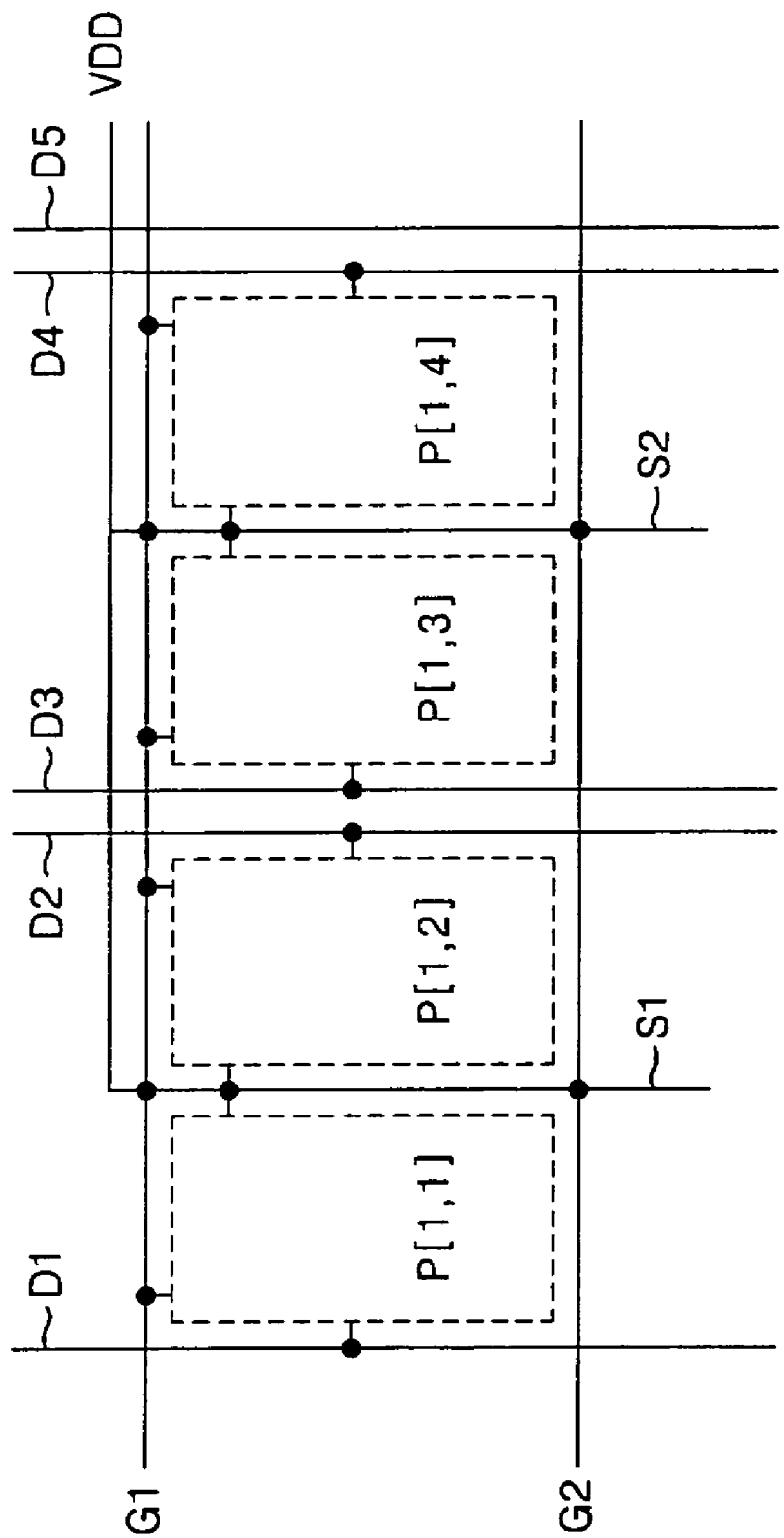

ORGANIC LIGHT EMITTING DIODE DISPLAY

This application claims the priority benefit of Korean Patent Application No. 10-2005-0058029 filed in Korea on Jun. 30, 2005, which is hereby incorporated by reference.

BACKGROUND OF THE INVENTION

1. Field of the Invention

This invention relates to an organic light emitting diode, and more particularly to an organic light emitting diode display device that is adaptive for reducing the number of power lines in an organic light emitting diode panel to thereby increase the aperture ratio of the display device as well as improve brightness.

2. Description of the Related Art

Recently, there have been highlighted various flat panel display devices reduced in weight and bulk that are capable of eliminating disadvantages of a cathode ray tube (CRT). Such flat panel display devices include a liquid crystal display (LCD), a field emission display (FED), a plasma display panel (PDP) and a light emitting diode (LED) display, etc.

The LED display device among such display devices employs an LED capable of light-emitting a phosphorous material by a re-combination of electrons with holes. The LED display device is generally classified into an inorganic LED device using an inorganic compound as the phosphorous material, and an organic LED (OLED) device using an organic compound as the phosphorous material. Such an OLED display device has been highlighted into a post-generation display device because it has advantages of a low voltage driving, a self-luminescence, a thin thickness, a wide viewing angle, a fast response speed and a high contrast, etc.

The OLED as a light emitting device usually includes an electron injection layer, an electron carrier layer, a light-emitting layer, a hole carrier layer and a hole injection layer that are disposed between a cathode and an anode of a light emitting diode. In such an OLED, when a predetermined voltage is applied between the anode and the cathode, electrons produced from the cathode are moved, via the electron injection layer and the electron carrier layer, into the light-emitting layer while holes produced from the anode are moved, via the hole injection layer and the hole carrier layer, into the light-emitting layer. Thus, the electrons and the holes fed from the electron carrier layer and the hole carrier layer emit a light by their re-combination at the light-emitting layer.

As shown in FIG. 1, an active matrix OLED display device employing the above-mentioned OLED includes an OLED panel 13 having n×m pixels P[i,j] arranged in a matrix type at each area defined by intersections between n gate lines G1 to Gn (wherein n is an integer) and m data lines D1 to Dm (wherein m is an integer), a gate driving circuit 12 for driving the gate lines G1 to Gn, a data driving circuit 11 for driving the data lines D1 to Dm, and m power voltage supply lines S1 to Sm arranged in parallel to the data lines D1 to Dm to supply a high-level power supply voltage VDD to each pixel P[i,j]. Herein, P[i,j] is a pixel positioned at an ith row and a jth column, wherein i is an integer smaller than or equal to n, and j is an integer smaller than or equal to m.

The gate driving circuit 12 supplies a scanning signal to the gate lines G1 to Gn to sequentially drive the gate lines G1 to Gn.

The data driving circuit 11 converts a digital data voltage inputted from the exterior thereof into an analog data voltage. Further, the data driving circuit 12 supplies the analog data voltage to the data lines D1 to Dm whenever the scanning signal is applied.

Each of the pixel P[i,j] receives a data voltage from the jth data line Dj whenever a scanning signal is applied to the ith gate line Gi, and generates a light corresponding to the data voltage.

To this end, each pixel P[i,j] includes an OLED having an anode connected to the jth power voltage supply line Sj, and an OLED driving circuit 15 connected to a cathode of the OLED to drive the OLED and the ith gate line G1 and the jth data line Dj to supply a low-level power supply voltage VSS.

The OLED driving circuit 15 includes a first transistor T1 for supplying a data voltage from the jth data line to a first node N1, a second transistor T2 for controlling an amount of current flowing at the OLED in response to a voltage at the first node N1, and a storage capacitor Cs in which the voltage at the first node N1 is charged.

The first transistor T is turned on when a scanning signal is applied, via the gate line Gi, thereto, so that it supplies a data voltage from the data line Dj to the first node N1. The data voltage supplied to the first node N1 is charged in the storage capacitor Cs and is supplied to a gate electrode of the second transistor T2. If the second transistor T2 is turned on by the data voltage supplied in this manner, then a current flows through the OLED. At this time, the current flowing through the OLED is generated by the high-level power supply voltage VDD from the jth power voltage supply line Sj, and an amount of the generated current is in proportion to a magnitude of the data voltage applied to the second transistor T2. Further, even when the first transistor T1 is turned off, the second transistor T2 is maintained at the turned-on state by a voltage at the first node N1 derived by the storage capacitor Cs charged with the data voltage to thereby control an amount of current flowing through the OLED until a data voltage at the next frame is supplied thereto.

Meanwhile, the above-mentioned OLED display device has the following problems.

As shown in FIG. 1, the OLED panel is provided with the power voltage supply line Sj for supplying the high-level power supply voltage VDD to each pixel. For instance, the OLED panel is provided with 800 power voltage supply lines Sj in the case of SVGA having a resolution of 800×600 while being provided with 1024 power voltage supply lines Sj in the case of XGA having a resolution of 1024×768. However, such a large number of the power voltage supply lines reduces an aperture ratio of the OLED panel and deteriorates brightness. It also can increase the cost and size of the OLED panel.

SUMMARY OF THE INVENTION

Accordingly, it is an object of the present invention to provide an OLED panel capable of reducing the number of lines and an OLED display device employing the OLED panel.

It is another object of the present invention is to provide an OLED display and its fabrication method, which address the limitations and disadvantages associated with the related art.

In order to achieve these and other objects of the invention, an organic light emitting diode display device according to an embodiment of the present invention includes first and second data lines; a power voltage supply line supplied with a high-level power supply voltage; a gate line crossing the first line, the second line and the power voltage supply line; a gate driving circuit for supplying a scanning signal to the gate line; a data driving circuit for supplying a data voltage to each of the data lines; first and second organic light emitting diodes commonly connected to the power voltage supply line; a first organic light emitting diode driving circuit for driving the first organic light emitting diode with the data voltage from the first data line in response to the scanning signal from the gate line; and a second organic light emitting diode driving circuit for driving the second organic light emitting diode with the data voltage from the second data line in response to the scanning signal from the gate line.

According to an aspect of the present invention, in the organic light emitting diode display device, the first organic light emitting diode driving circuit includes a first transistor for supplying the data voltage from the first data line to a first node in response to the scanning signal from the gate line; a second transistor for controlling a current amount flowing through the first organic light emitting diode by a voltage at the first node; and a first storage capacitor for charging the voltage at the first node.

Further, according to an aspect of the present invention, the second organic light emitting diode driving circuit includes a third transistor for supplying the data voltage from the second data line to a second node in response to the scanning signal from the gate line; a fourth transistor for controlling a current amount flowing through the second organic light emitting diode by a voltage at the second node; and a second storage capacitor for charging the voltage at the second node. Herein, the gate driving circuit is formed on a substrate provided with the data lines, the power voltage supply line, the gate line, the organic light emitting diodes and the organic light emitting diode driving circuits.

An organic light emitting diode display device according to another embodiment of the present invention includes m data lines (wherein m is an integer); n gate lines (wherein n is an integer) crossing the data lines; k power voltage supply lines (wherein k is an integer smaller than m/2) supplied with a high-level power supply voltage and arranged in parallel to the data lines between the data lines; a plurality of reset lines making a pair with the gate lines; first and second organic light emitting diodes commonly connected to the power voltage supply lines; a first pixel including the first organic light emitting diode, and a first organic light emitting diode driving circuit for driving the first organic light emitting diode with the data voltage from the odd-numbered data lines in response to the scanning signal from the gate line, the first organic light emitting diode being initialized in response to a reset signal from the reset line; a second pixel including the second organic light emitting diode, and a second organic light emitting diode driving circuit for driving the second organic light emitting diode with the data voltage from the even-numbered data lines in response to the scanning signal from the gate line, the second organic light emitting diode being initialized in response to a reset signal from the reset line; a gate driving circuit for sequentially applying the scanning signal to the gate lines; a data driving circuit for supplying the data voltage to each of the data lines; and a reset driving circuit for applying the reset signal to the reset lines.

According to an aspect of the present invention, in the organic light emitting diode display device, the first organic light emitting diode driving circuit includes a first transistor for supplying the data voltage from the odd-numbered data lines to a first node in response to the scanning signal from the gate line; a second transistor for controlling a current amount flowing through the first organic light emitting diode by a voltage at the first node; and a third transistor for discharging the first node in response to the reset signal from the reset line.

Further, according to an aspect of the present invention, the second organic light emitting diode driving circuit includes a fourth transistor for supplying the data voltage from the even-numbered data lines to a second node in response to the scanning signal from the gate line; a fifth transistor for controlling a current amount flowing through the second organic light emitting diode by a voltage at the second node; and a sixth transistor for discharging the second node in response to the reset signal from the reset line.

Herein, the reset signal is generated more lately than the scanning signal. Preferably, the reset signal is generated lately by more than ½ frame interval in comparison to the scanning signal.

According to an aspect of the present invention, in the organic light emitting diode display device, the gate driving circuit includes a shift register for sequentially generating the scanning signal in response to a clock signal generated in accordance with a predetermined clock frequency, the reset signal being generated at a frequency of 1/c×the clock frequency (wherein c is an integer) to be supplied simultaneously to the c reset lines.

According to an aspect of the present invention, in the organic light emitting diode display device, the reset driving circuit sequentially applies the reset signal to the reset lines. Herein, the gate driving circuit and the reset driving circuits are formed on a substrate provided with the data lines, the gate lines, the power voltage supply lines, the reset lines, the organic light emitting diodes and the organic light emitting diode driving circuits.

An organic light emitting diode display device according to still another embodiment of the present invention includes m data lines (wherein m is an integer); n gate lines (wherein n is an integer) crossing the data lines; a plurality of power voltage supply lines supplied with a high-level power supply voltage and arranged in parallel to the data lines between the data lines; a plurality of reset lines making a pair with the gate lines; first, second, third and fourth organic light emitting diodes commonly connected to a single of same power voltage supply line; a first pixel including the first organic light emitting diode, and a first organic light emitting diode driving circuit for driving the first organic light emitting diode with the data voltage from the odd-numbered data lines in response to the scanning signal from the odd-numbered gate lines, the first organic light emitting diode being initialized in response to a reset signal from the reset line; a second pixel including the second organic light emitting diode, and a second organic light emitting diode driving circuit for driving the second organic light emitting diode with the data voltage from the even-numbered data lines in response to the scanning signal from the odd-numbered gate lines, the second organic light emitting diode being initialized in response to a reset signal from the reset line; a third pixel including the third organic light emitting diode, and a third organic light emitting diode driving circuit for driving the third organic light emitting diode with the data voltage from the odd-numbered data lines in response to the scanning signal from the even-numbered gate lines, the third organic light emitting diode being initialized in response to a reset signal from the reset line; a fourth pixel including the fourth organic light emitting diode, and a fourth organic light emitting diode driving circuit for driving the fourth organic light emitting diode with the data voltage from the even-numbered data lines in response to the scanning signal from the even-numbered gate lines, the second organic light emitting diode being initialized in response to a reset signal from the reset line; a gate driving circuit for sequentially applying the scanning signal to the gate lines; a data driving circuit for supplying the data voltage to each of the data lines; and a reset driving circuit for applying the reset signal to the reset lines.

According to an aspect of the present invention, in the organic light emitting diode display device, the first to fourth pixels are simultaneously initialized by the reset signal applied via a single of same reset line. In the organic light emitting diode display device, the first organic light emitting diode driving circuit includes a first transistor for supplying the data voltage from the odd-numbered data lines to a first node in response to the scanning signal from the odd-numbered gate lines; a second transistor for controlling a current amount flowing through the first organic light emitting diode by a voltage at the first node; and a third transistor for discharging the first node in response to the reset signal from the reset line.

Further, according to an aspect of the present invention, the second organic light emitting diode driving circuit includes a fourth transistor for supplying the data voltage from the even-numbered data lines to a second node in response to the scanning signal from the odd-numbered gate lines; a fifth transistor for controlling a current amount flowing through the second organic light emitting diode by a voltage at the second node; and a sixth transistor for discharging the second node in response to the reset signal from the reset line.

Furthermore, according to an aspect of the present invention, the third organic light emitting diode driving circuit includes a seventh transistor for supplying the data voltage from the odd-numbered data lines to a third node in response to the scanning signal from the even-numbered gate lines; an eighth transistor for controlling a current amount flowing through the third organic light emitting diode by a voltage at the third node; and a ninth transistor for discharging the third node in response to the reset signal from the reset line.

Moreover, according to an aspect of the present invention, the fourth organic light emitting diode driving circuit includes a tenth transistor for supplying the data voltage from the even-numbered data lines to a fourth node in response to the scanning signal from the even-numbered gate lines; an eleventh transistor for controlling a current amount flowing through the fourth organic light emitting diode by a voltage at the fourth node; and a twelfth transistor for discharging the fourth node in response to the reset signal from the reset line.

Herein, the reset signal is generated more lately than the scanning signal. Preferably, the reset signal is generated lately by more than ½ frame interval in comparison to the scanning signal.

According to an aspect of the present invention, in the organic light emitting diode display device, the gate driving circuit includes a shift register for sequentially generating the scanning signal in response to a clock signal generated in accordance with a predetermined clock frequency, the reset signal being generated at a frequency of $1/c\times$the clock frequency (wherein c is an integer) to be supplied simultaneously to the c reset lines. Herein, the reset driving circuit sequentially applies the reset signal to the reset lines.

According to an aspect of the present invention, in the organic light emitting diode display device, the gate driving circuit and the reset driving circuits are formed on a substrate provided with the data lines, the gate lines, the power voltage supply lines, the reset lines, the organic light emitting diodes and the organic light emitting diode driving circuits.

According to another aspect, the present invention provides an organic light emitting diode display device, comprising: first and second data lines; a power voltage supply line supplied with a power supply voltage; a gate line crossing the first data line, the second data line and the power voltage supply line; first and second organic light emitting diodes commonly connected to the power voltage supply line; a first organic light emitting diode driving circuit for driving the first organic light emitting diode with a data voltage from the first data line in response to a scanning signal from the gate line; and a second organic light emitting diode driving circuit for driving the second organic light emitting diode with a data voltage from the second data line in response to the scanning signal from the gate line.

According to another aspect, the present invention provides an organic light emitting diode display device, comprising: m data lines, wherein m is an integer; n gate lines crossing the data lines, wherein n is an integer; a plurality of power voltage supply lines supplied with a power supply voltage and arranged in parallel to the data lines between the data lines; a plurality of reset lines provided between the gate lines; and first, second, third and fourth organic light emitting diodes commonly connected to a same one of the power voltage supply lines, wherein two of the first through fourth organic light emitting diodes are horizontally adjacent to each other.

According to another aspect, the present invention provides an organic light emitting diode display device comprising: first and second data lines adjacent to each other and respectively supplying first and second data signals; first and second gate lines adjacent to each other and respectively supplying first and second scanning signals, the first and second gate lines crossing the first and second data lines; and at least first and second pixels provided at an area formed between the first and second data lines and the first and second gate lines.

According to another aspect, the present invention provides a method of forming an organic light emitting diode display device, the method comprising: forming first and second data lines adjacent to each other on a substrate, the first and second data lines respectively supplying first and second data signals; forming first and second gate lines adjacent to each other on the substrate, the first and second gate lines respectively supplying first and second scanning signals and crossing the first and second data lines; and forming at least first and second pixels at an area formed between the first and second data lines and the first and second gate lines.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects of the invention will be apparent from the following detailed description of the embodiments of the present invention with reference to the accompanying drawings, in which:

FIG. 2B is a diagram showing adjacent pixels of the display device of FIG. 2A;

DETAILED DESCRIPTION OF THE PREFERRED EMBODIMENTS

With reference to FIGS. 2A to 12, the preferred embodiments of the present invention will be explained as examples as follows.

Figure 1:
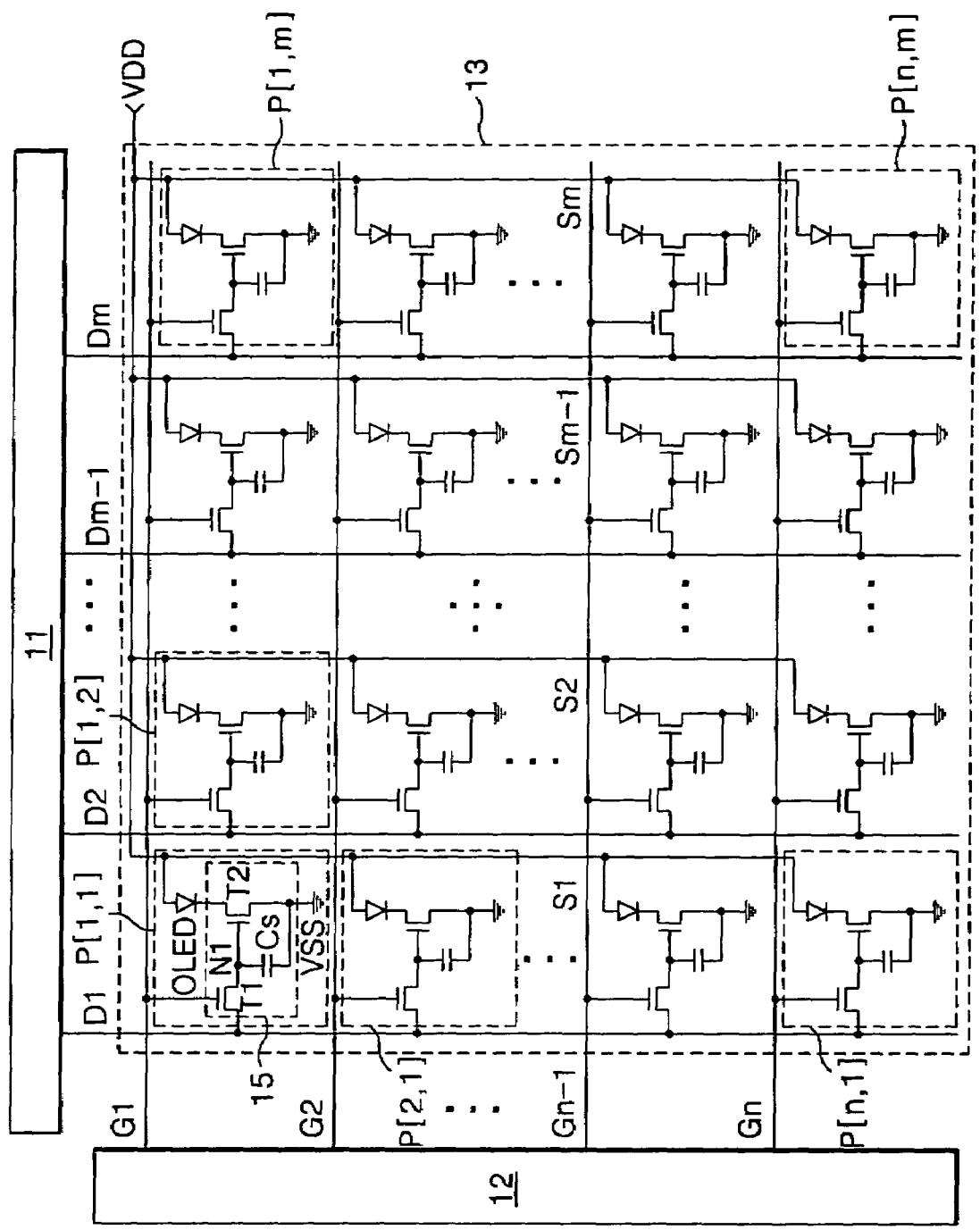
FIG. 1 is a schematic block circuit diagram showing a configuration of a related art organic light emitting diode display device.
Figure 2A:
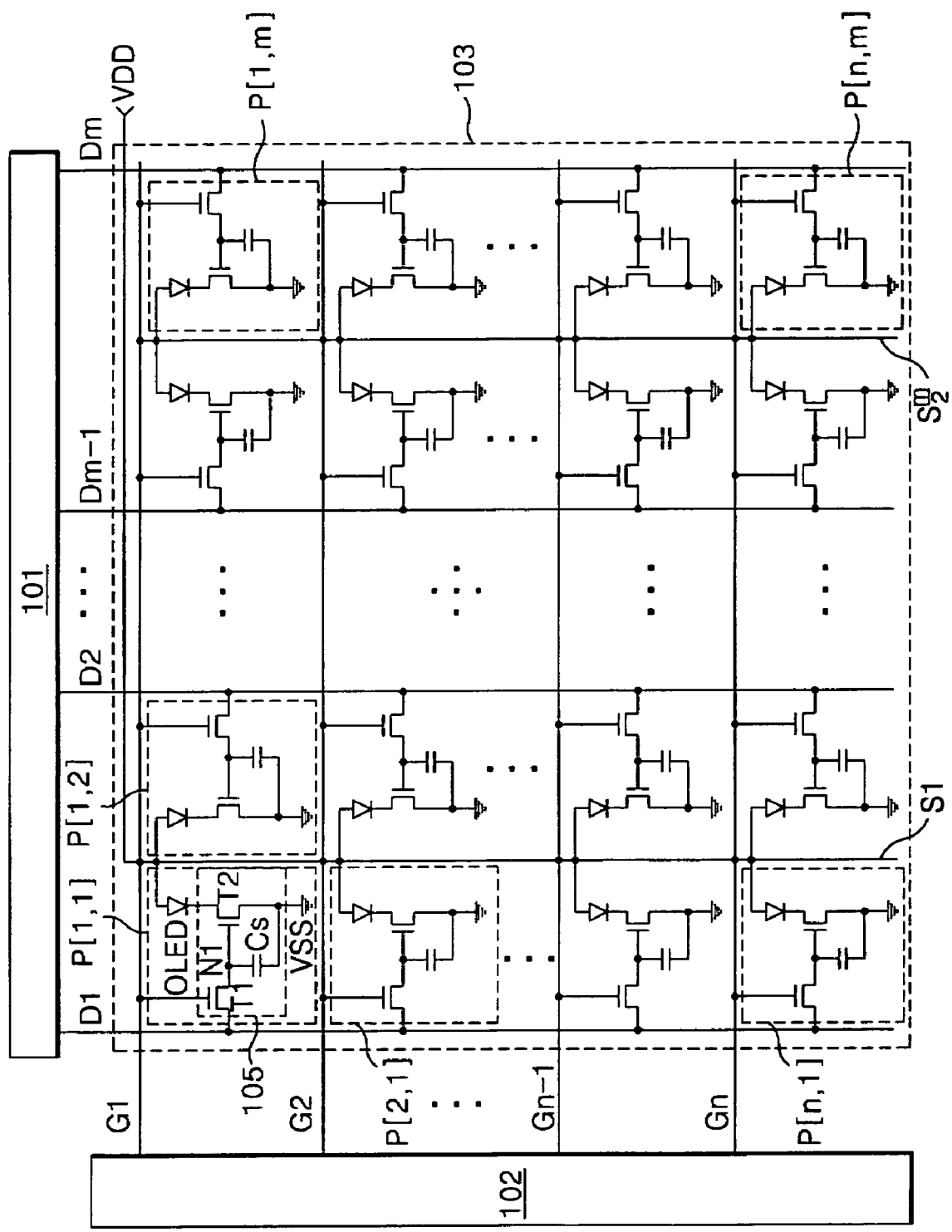
FIG. 2A is a schematic block circuit diagram showing a configuration of an organic light emitting diode display device according to a first embodiment of the present invention.

Referring to FIGS. 2A and 2B, an OLED display device according to a first embodiment of the present invention includes an OLED panel 103 having n×m pixels P[i,j] arranged in a n×m matrix type at each area defined by n gate lines G1 to Gn, m data lines D1 to Dm, and m/2 power voltage supply lines (wherein P[i,j] is a pixel positioned at an i row and a j column and wherein i is an integer smaller than or equal to n, and j is an integer smaller than or equal to m), a gate driving circuit 102 for driving the gate lines G1 to Gn of the OLED panel 103, and a data driving circuit 101 for driving the data lines D1 to Dm of the OLED panel 103. All the components of the OLED display device including the OLED panel 103 are operatively configured and coupled.

The gate driving circuit 102 supplies a scanning signal to the gate lines G1 to Gn to sequentially drive the gate lines G1 to Gn.

The data driving circuit 101 converts a digital data signal inputted from the exterior thereof into an analog data signal. Further, the data driving circuit 101 supplies the analog data signal to the data lines D1 to Dm whenever the scanning signal is applied thereto.

In the OLED panel 103, each of the power voltage supply lines S1 to Sm/2 is arranged between one of odd-numbered data lines D1, D3, . . . , Dm and the adjacent one of even-numbered data lines D2, D4, . . . , Dn. In other words, each area defined by two adjacent gate lines and two adjacent data lines that cross those gate lines, has two pixels that are separated by a single power voltage supply line. The OLEDs in these two pixels are powered by the same single power voltage supply line. For instance, pixels P[1,1] and P[1,2] are positioned between the data lines D1 and D2 and the gate lines G1 and G2, and are controlled by the same power voltage supply line S1. As a result, the number of power voltage supply lines can be reduced dramatically, e.g., from m to m/2.

Also, as shown in FIG. 2B, for all the pixels directly connected to a particular gate line, each data line is directly connected to only one of those pixels. For instance, for all the pixels (P[1,1], P[1,2], . . . , P[1,m]) directly connected to the gate line G1, the data line D2, e.g., is directly connected to a single pixel P[1,2]. Accordingly, each of the pixels in the panel can be selectively driven as needed.

The pixels P[i,j] is provided at a pixel area defined between two adjacent gate lines, a single data line and a single power voltage supply line. Each pixel P[i,j] receives a data signal from the corresponding jth data line Dj whenever a scanning signal is applied to the corresponding ith gate line G1, and generates a light corresponding to the data voltage.

Each pixel P[i,j] includes one OLED having an anode connected to the corresponding one of the power voltage supply lines S1 to Sm/2, and an OLED driving circuit 105 connected to a cathode of the OLED to drive the OLED and the ith gate line G1 and the jth data line Dj to supply a low-level power supply voltage VSS.

Assuming that a pixel at the odd column should be P[i,2k−1] while a pixel at the even column should be P[i,2k] where k is a positive integer, the OLED provided at each of the pixel P[i,2k−1] at the odd column and the pixel P[i,2k] at the even column adjacent thereto receives the high-level power supply voltage VDD from the same one of the power voltage supply lines S1 to Sm/2.

Each OLED driving circuit 105 includes a first transistor T1 for supplying a data voltage from the corresponding one of the data lines D1 to Dm to a first node N1 in response to a scanning signal from the corresponding one of the gate lines G1 to Gm, a second transistor T2 for controlling an amount of current flowing at the OLED in response to a voltage at the first node N1, and a storage capacitor Cs for charging a difference voltage between a voltage at the first node N1 and the low-level power supply voltage VSS. The first to second transistors T1 and T2 can utilize an amorphous silicon and a polycrystalline silicon as a semiconductor layer. The transistors T1 and T2 are implemented by N-type MOS transistors, but can be implemented with other types.

The first transistor T1 is turned on in response to a scanning signal from the corresponding one of the gate lines G1 to Gn, so that it supplies a data voltage from the corresponding one of the data lines D1 to Dm to the first node N1. The data voltage supplied to the first node N1 is charged in the storage capacitor Cs and is supplied to a gate electrode of the second transistor T2. If the second transistor T2 is turned on by the data voltage supplied to the first node N1, then a current corresponding to the data voltage flows through the OLED. At this time, the current flowing through the OLED is generated by the high-level power supply voltage VDD from the kth power voltage supply line Sk, and an amount of the current is in proportion to a magnitude of the data voltage applied to the second transistor T2. Further, even when the first transistor T1 is turned off, the second transistor T2 is maintained at the turned-on state by the storage capacitor Cs charged with the data voltage to thereby control the amount of current flowing through the OLED until a data voltage at the next frame is supplied thereto.

As described above, in the OLED display device according to the first embodiment of the present invention, two adjacent pixels of the OLED panel 103 share one same power voltage supply line supplied with the high-level power supply voltage to thereby effectively reduce the number of power voltage supply lines to a half. This improves the aperture ratio of the OLED panel and brightness and also can reduce the size and cost of the OLED panel.

Figure 3:
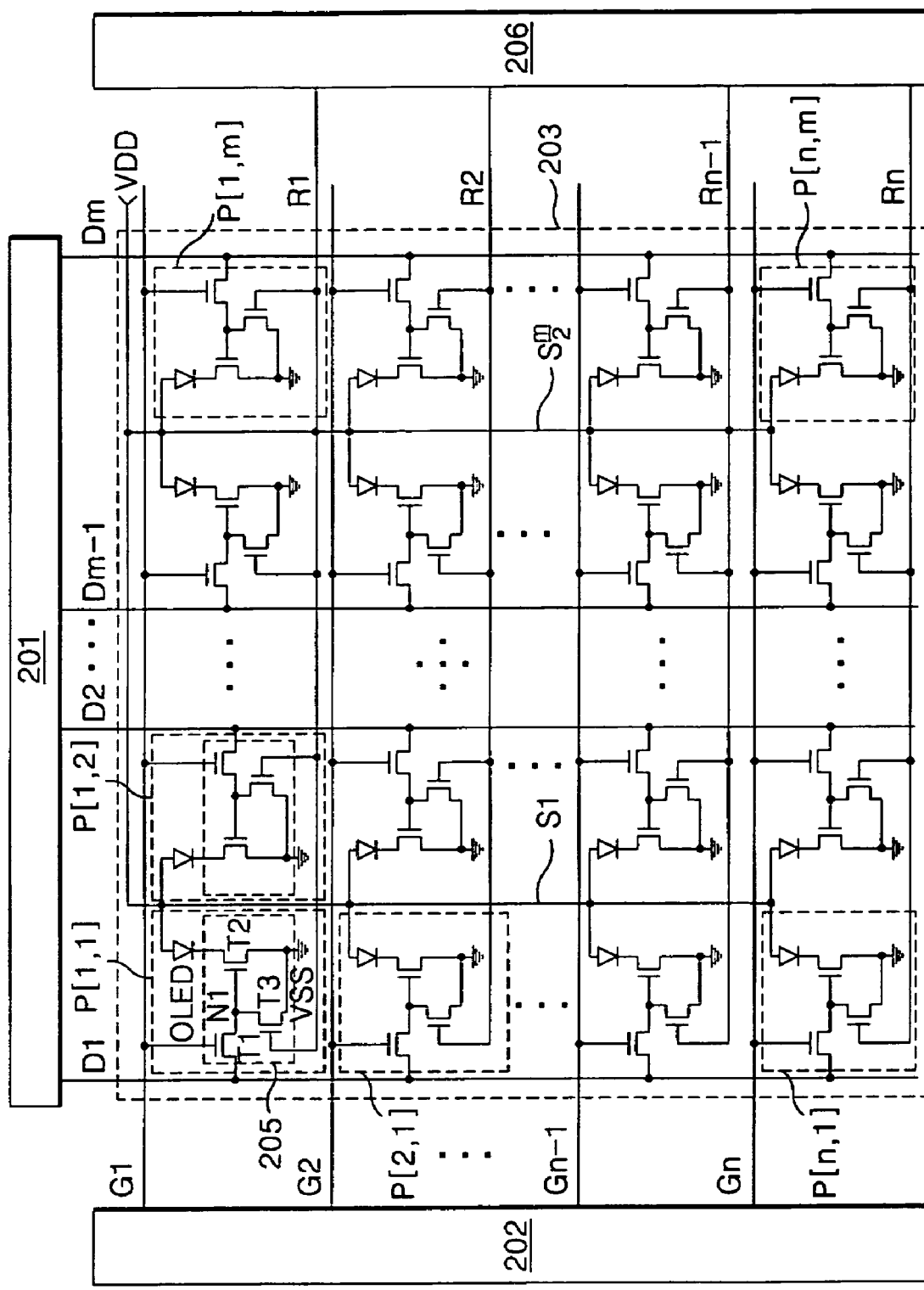
FIG. 3 is a schematic block circuit diagram showing a configuration of an organic light emitting diode display device according to a second embodiment of the present invention.

FIG. 3 shows a configuration of an organic light emitting diode display device according to a second embodiment of the present invention.

Referring to FIG. 3, an OLED display device according to the second embodiment of the present invention includes an OLED panel 203 having n×m pixels P[i,j] arranged in a n×m matrix type at each area defined by n gate lines G1 to Gn, m data lines D1 to Dm, m/2 power voltage supply lines S1 to Sm/2 and n reset lines R1 to Rn for supplying a reset signal to each pixel P[i,j], a gate driving circuit 202 for driving the gate lines G1 to Gn of the OLED panel 203, and a data driving circuit 201 and a reset driving circuit 206 for driving the data lines D1 to Dm of the OLED panel 203. All the components of the OLED display device including the OLED panel 203 are operatively configured and coupled.

The gate driving circuit 202 supplies a scanning signal to the gate lines G1 to Gn to sequentially drive the gate lines G1 to Gn.

The data driving circuit 201 converts a digital data signal inputted from the exterior thereof into an analog data signal. Further, the data driving circuit 201 supplies the analog data signal to the data lines D1 to Dm whenever the scanning signal is applied thereto.

The reset driving circuit 206 generates a reset signal following the scanning signal and sequentially supplies the reset signal to the reset lines R1 to Rn. The reset signal initializes the OLED driving circuits 205 to which the reset signal is applied.

In the OLED panel 203, as discussed in the above-mentioned first embodiment as shown in FIGS. 2A and 2B, the power voltage supply lines S1 to Sm/2 are arranged one by one between odd-numbered data lines D1, D3, ..., Dm−1 and even-numbered data lines D2, D4, ..., Dm. That is, two adjacent pixels share only one same power supply line.

The gate lines G1 to Gn and the reset lines R1 to Rn cross the data lines D1 to Dm and the power voltage supply lines S1 to Sm/2. The gate lines G1 to Gn and the reset lines R1 to Rn are alternately arranged to each other. A single gate line and a single reset line make a pair, and pixels are formed between such a pair of gate line and reset line.

Similar to the above-mentioned first embodiment as shown in FIGS. 2A and 2B, in the second embodiment, the OLED provided at each of the pixel P[i,2k−1] at the odd column and the pixel P[i,2k] at the even column adjacent thereto receives the high-level power supply voltage VDD from the same corresponding one of the power voltage supply lines S1 to Sm/2.

Each OLED driving circuit 205 includes a first transistor T1 for supplying a data voltage from the corresponding one of the data lines D1 to Dm to a first node N1 in response to a scanning signal from the corresponding one of the gate lines G1 to Gm, a second transistor T2 for controlling an amount of current flowing at the OLED in response to a voltage at the first node N1, and a third transistor T3 for discharging the first node N1 to a reset signal from the corresponding one of the reset lines R1 to Rn.

A gate electrode of the first transistor T1 is connected to the corresponding one of the gate lines G1 to Gn while a source electrode thereof is connected to a single one of the data line D1 to Dm. Further, a drain electrode of the first transistor T1 is connected to the first node N1.

A gate electrode of the second transistor T2 is connected to the first node N1 while a source electrode is connected to a cathode of the OLED. Further, a drain electrode of the second transistor T2 is connected to the low-level power supply VSS.

A gate electrode of the third transistor T3 is connected to the corresponding one of the reset lines R1 to Rn while a source electrode is connected to the first node N1. Further, a drain electrode of the third transistor T3 is connected to the low-level power supply VSS.

The transistors T1 to T3 are implemented by N-type MOS transistors, but can be implemented with other types. The first to third transistors T1 to T3 can utilize an amorphous silicon and a polycrystalline silicon as a semiconductor layer.

If the first transistor T1 is turned on in response to a scanning signal, then a data voltage from the corresponding one of the data lines D1 to Dm is supplied to the first node N1. The data voltage supplied to the first node N1 is applied to the gate electrode of the second transistor T2. When the second transistor T2 is turned on by the data voltage supplied in this manner, a current flows through the OLED. At this time, the current flowing through the OLED is generated by the high-level power supply voltage VDD, and an amount of the generated current is in proportion to a magnitude of the data voltage applied to the gate electrode of the second transistor T2. Further, even when the first transistor T1 is turned off, the second transistor T2 is maintained at its turned-on state by a data voltage floated on the first node N1. Subsequently, the third transistor T3 is turned on by a reset signal, so that the second transistor T2 is maintained at the turned-on state until the first node N1 is discharged.

The OLED driving circuit 205 discharges a control node (i.e., first node) of the OLED driving device (i.e., second transistor) every constant period to reduce a deterioration caused by a gate-bias stress of the OLED driving device and hence prevent a characteristic change caused by a deterioration of the OLED driving device, thereby assuring reliability for the operation of the OLED driving circuit 205.

Figure 4:
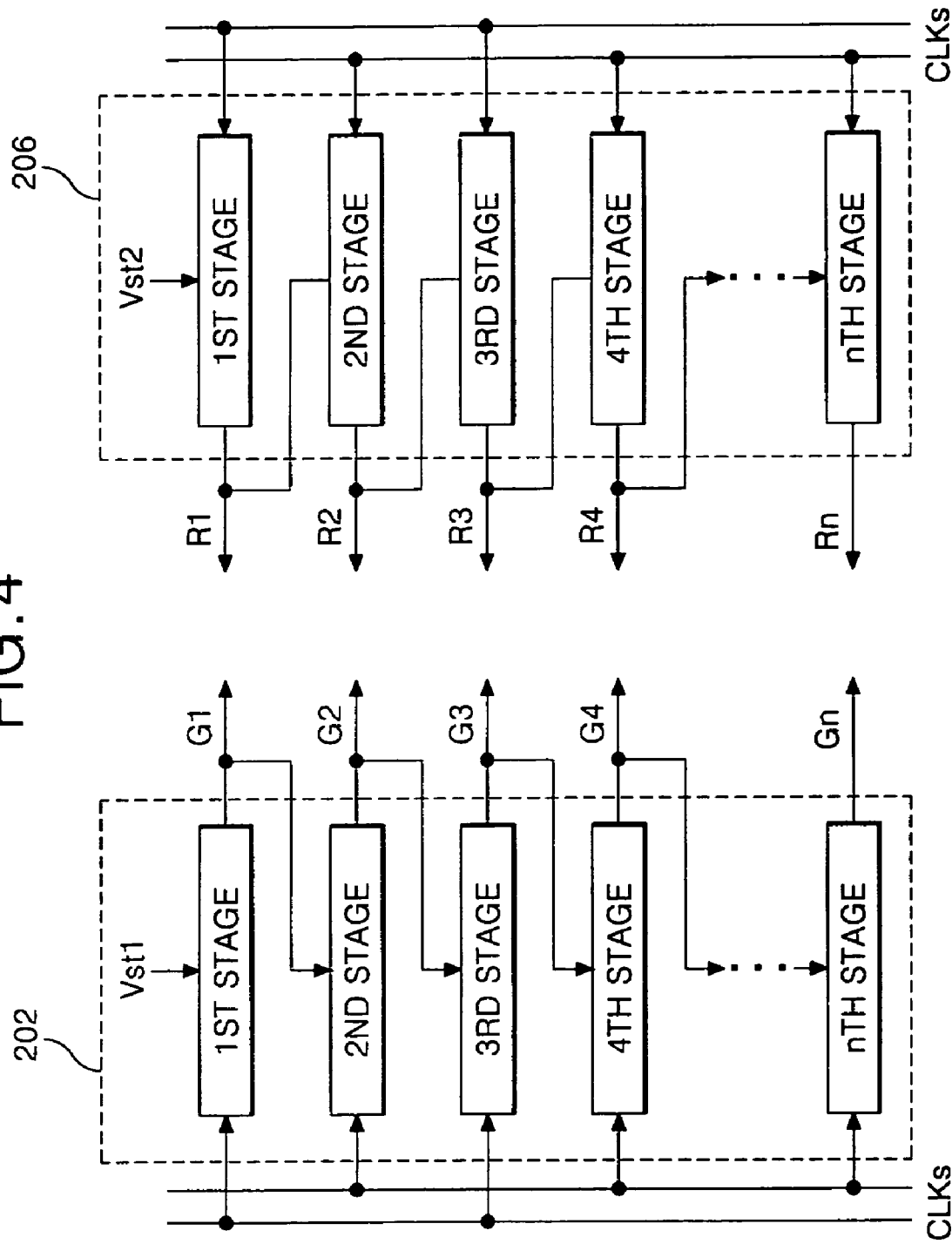
FIG. 4 is a schematic block diagram of an example of the gate driving circuit and the reset driving circuit shown in FIG. 3.

FIG. 4 schematically shows an example of the gate driving circuit 202 and the reset driving circuit 206 of FIG. 3 for supplying a scanning signal and a reset signal, respectively.

Referring to FIG. 4, the gate driving circuit 202 includes a shift register composed of n stages connected in cascade. In this shift register, a first start signal Vst1 is inputted to the 1st stage while an output signal at the previous stage is inputted to the 2nd to nth stages as a start signal. Each stage has the same circuit configuration, and shifts the start signal Vst1 or the output signal at the previous stage in response to a clock signal to generate a scanning pulse having a pulse width of one horizontal period. The scanning signal generated in this manner is sequentially applied to the gate lines G1 to Gn.

The reset driving circuit 206 includes a shift register composed of n stages, each of which has the same circuit configuration as the shift register stage of the gate driving circuit 202. A clock signal supplied to the reset driving circuit 206 has the same period and the same duration time as the clock signal supplied to the gate driving circuit 202.

Meanwhile, the reset signal supplied to the first reset line R1 is delayed in comparison to the scanning signal supplied to the ith gate line G1. In order to supply a reset signal delayed in comparison to the scanning signal, a time difference should be put between the first start signal Vst1 and the second start signal Vst2. It is preferable that a timing supplied with the reset signal should be delayed by about ½ frame interval in comparison to the scanning signal supplied to the ith gate line G1. Further, the reset signal may be supplied once every frame interval or for each several frame interval.

Figure 5:
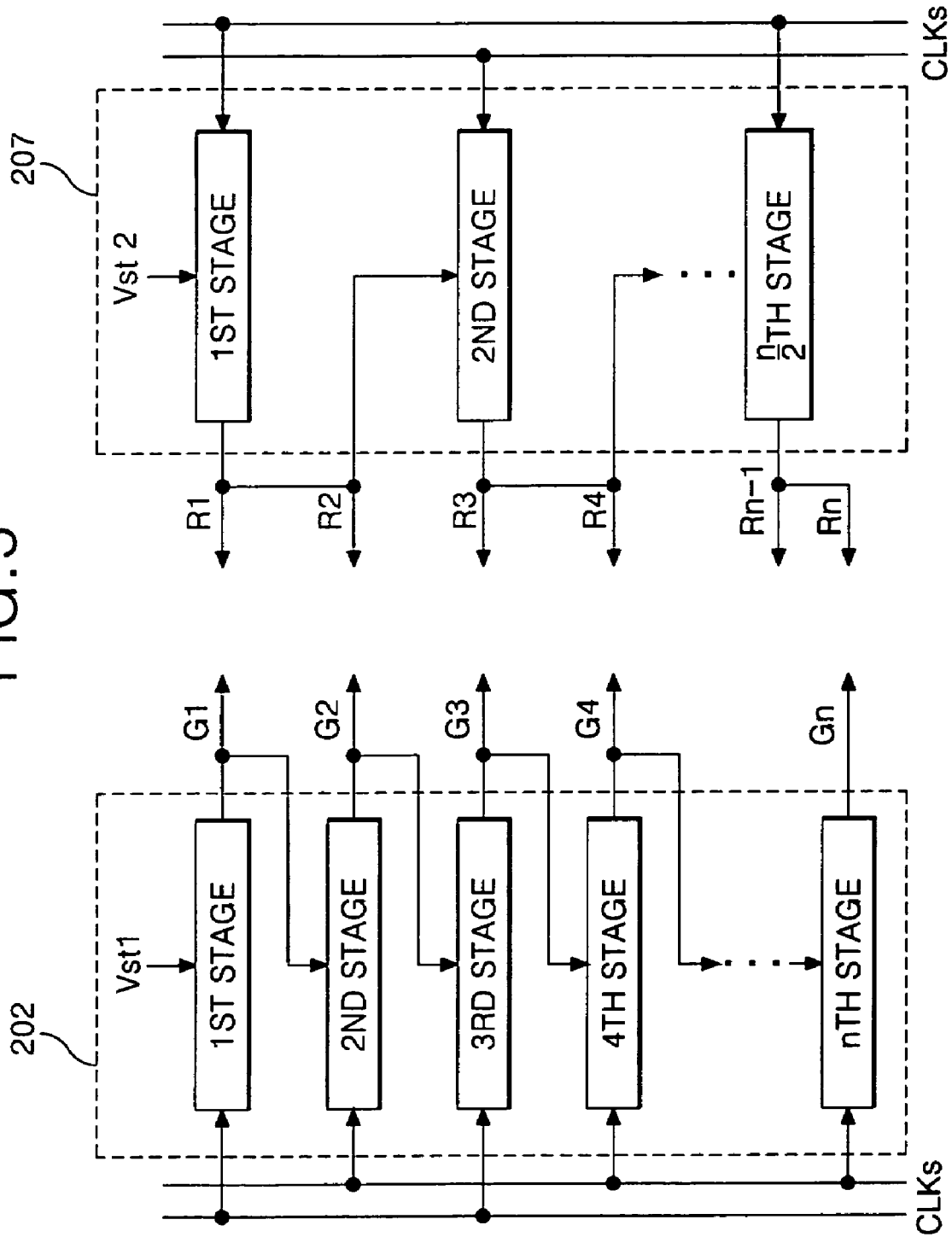
FIG. 5 is a schematic block diagram of another example of the gate driving circuit and the reset driving circuit shown in FIG. 3.

FIG. 5 shows another example of a reset driving circuit (207) having a configuration different from the reset driving circuit 206 of FIG. 4. The reset driving circuit 207 can be applied to the reset driving circuit 206 of FIG. 3.

In the reset driving circuit 207 shown in FIG. 5, a reset signal is supplied to two reset lines Ri and Ri+1 at one stage such that the reset driving circuit 207 has n/2 stages. To this end, a clock signal supplied to the reset driving circuit 207 of FIG. 5 has twice larger period and twice larger duration time than the clock signal supplied to the reset driving circuit 206 of FIG. 4. Alternatively, a method of simultaneously supplying a reset signal to three or more reset lines at one stage can be used in the present invention.

As described above, in the OLED display device according to the second embodiment of the present invention, two adjacent pixels of the OLED panel 203 share one same power voltage supply line supplied with the high-level power supply voltage to thereby reduce the number of power voltage supply lines that are used in the OLED panel 203 to a half, and the control node of the OLED driving device is discharged by the reset signal to thereby prevent a characteristic change caused by a deterioration of the OLED driving device and hence improve reliability for the operation of the OLED driving circuit.

Figure 6:
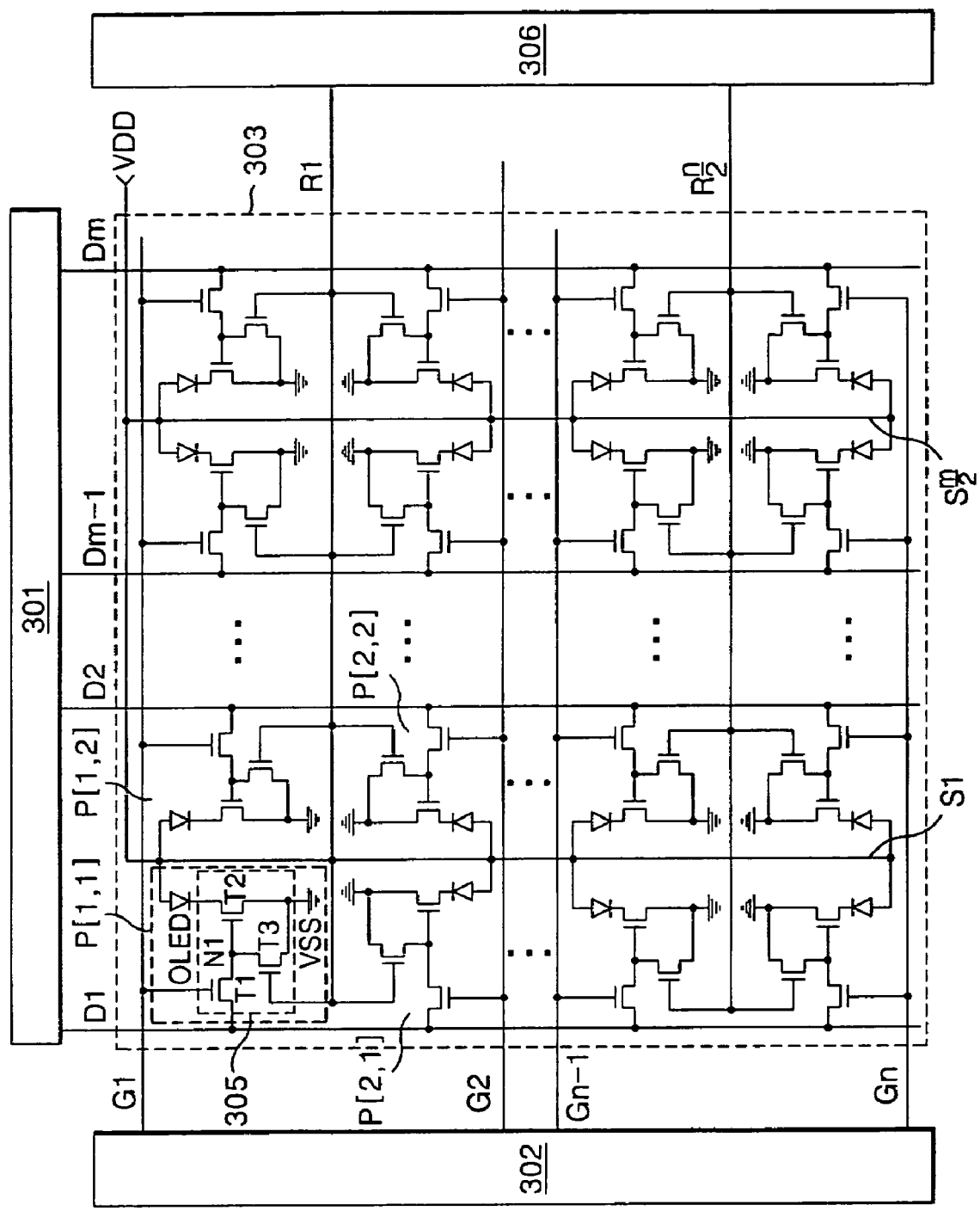
FIG. 6 is a schematic block circuit diagram showing a configuration of an organic light emitting diode display device according to a third embodiment of the present invention.

FIG. 6 shows a configuration of an organic light emitting diode display device according to a third embodiment of the present invention.

Referring to FIG. 6, an OLED display device according to the third embodiment of the present invention includes an OLED panel 303 having n×m pixels P[i,j] arranged in a n×m matrix type at each area defined by n gate lines G1 to Gn, m data lines D1 to Dm, m/2 power voltage supply lines S1 to Sm/2, n/2 reset lines R1 to Rn/2, a gate driving circuit 302 for driving the gate lines G1 to Gn of the OLED panel 303, a data driving circuit 301 for driving the data lines D1 to Dm of the OLED panel 303, and a reset driving circuit 306. Here P[i,j] is a pixel positioned at an i row and a j column, whereas i is an integer smaller than or equal to n, and j is an integer smaller than or equal to m. All the components of the OLED display device including the OLED panel 303 are operatively configured and coupled.

The gate driving circuit 302 supplies a scanning signal to the gate lines G1 to Gn to sequentially drive the gate lines G1 to Gn.

The reset driving circuit 306 generates a reset signal following the scanning signal and sequentially supplies the reset signal to the reset lines R1 to Rn/2. Herein, the reset signal is generated to have a frequency corresponding to 1/c (wherein c is an integer) of the frequency of the clock supplied to the gate driving circuit 302, and is simultaneously or sequentially applied to c reset lines. The reset signal initializes the OLED driving circuits 305 to which the reset signal is applied.

The data driving circuit 301 converts a digital data signal inputted from the exterior thereof into an analog data signal. Further, the data driving circuit 301 supplies the analog data signal to the data lines D1 to Dm whenever the scanning signal is applied thereto.

The gate lines G1 to Gn and the reset lines R1 to Rn/2 cross the data lines D1 to Dm and the power voltage supply lines S1 to Sm/2. A single one of the power voltage supply line S1 to Sm/2 is arranged between one of odd-numbered data lines D1, D3, ..., Dm−1 and one of even-numbered data lines D2, D4, ..., Dm adjacent thereto. A single one of the reset line R1 to Rn/2 is arranged between one of odd-numbered gate lines G1, G3, ..., Gn−1 and one of even-numbered gate lines G2, G4, ..., Gn adjacent thereto. That is, one of the differences between the OLED panels of FIGS. 3 and 6 is that in FIG. 6, there exist four pixels in an area defined by a pair of adjacent gate lines and a pair of adjacent data lines crossing these gate lines. In other words, the gate lines are connected to the pixels in a similar manner as the data lines, and the reset lines are connected to the pixels in a similar manner as the power voltage supply lines. For instance, pixels P[1,1], P[1,2], P[2,1] and P[2,2] are provided between the gate lines G1 and G2 and the data lines G1 and G2. The same power voltage supply line S1 supplies a voltage directly to all four OLEDs in these four pixels. The same reset line R1 supplies a reset voltage directly to these four pixels. As a result, the number of power voltage supply lines and the number of reset lines are reduced, e.g., to a half.

The configuration of FIG. 2B is equally applied to the data lines as well as the gate lines of FIG. 6. Accordingly, each of the pixels in the OLED panel 303 can be selectively driven as needed.

The OLED provided at each of the pixel P[i,2k−1] at the odd column and the pixel P[i,2k] at the even column adjacent thereto receives the high-level power supply voltage VDD from the same corresponding one of the power voltage supply line S1 to Sm/2.

Each of the pixels P[i,j] receives a data signal from the jth data line Dj when a scanning signal is applied to the ith gate line Gi to thereby generate a light corresponding to the data signal.

Each OLED driving circuit 305 includes a first transistor T1 for supplying a data voltage from the corresponding one of the data lines D1 to Dm to a first node N1 in response to a scanning signal from the corresponding one of the gate lines G1 to Gm, a second transistor T2 for controlling an amount of current flowing at the OLED in response to a voltage at the first node N1, and a third transistor T3 for discharging the first node N1 to a reset signal from the corresponding one of the reset lines R1 to Rn/2.

For instance, at the pixels P[4i+1,4j+1] arranged at the (4i+1)th column and the (4j+1)th row, a gate electrode of the first transistor T1 is connected to the (4i+1)th gate lines G1, G5, ..., Gn−3 while a source electrode thereof is connected to the (4j+1)th data lines D1, D5, ..., Dm−3. Further, a drain electrode of the first transistor T1 is connected to the first node N1. At these pixels P[4i+1,4j+1], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+1,4j+1], a gate electrode of the third transistor T3 is connected to the corresponding one of the odd-numbered reset lines R1, R3, Rn/2−1 while a source electrode thereof is connected to the first node N1. A drain electrode of the third transistor T3 is connected to the low-level power supply VSS. At these pixels P[4i+1,4j+1], an anode of the OLED is connected to the corresponding one of the odd-numbered power voltage supply lines S1, S3, ..., Sm/2−1.

At the pixels P[4i+1,4j+2] arranged at the (4i+1)th column and the (4j+2)th row, a gate electrode of the first transistor T1 is connected to the (4i+1)th gate lines G1, G5, ..., Gn−3 while a source electrode thereof is connected to the (4j+2)th data lines D2, D6, ..., Dm−2. Further, a drain electrode of the first transistor T1 is connected to the first node N1. At these pixels P[4i+1,4j+2], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+1,4j+2], a gate electrode of the third transistor T3 is connected to the corresponding one of the odd-numbered reset lines R1, R3, . . . , Rn/2−1 while a source electrode thereof is connected to the first node N1. A drain electrode of the third transistor T3 is connected to the low-level power supply VSS. At these pixels P[4i+1,4j+2], an anode of the OLED is connected to the corresponding one of the odd-numbered power voltage supply lines S1, S3, . . . , Sm/2−1.

At the pixels P[4i+1,4j+3] arranged at the (4i+1)th column and the (4j+3)th row, a gate electrode of the first transistor T1 is connected to the (4i+1)th gate lines G1, G5, . . . , Gn−3 while a source electrode thereof is connected to the (4j+3)th data lines D3, D7, . . . , Dm−1. Further, a drain electrode of the first transistor T1 is connected to the first node N1. At these pixels P[4i+1,4j+3], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+1,4j+3], a gate electrode of the third transistor T3 is connected to the corresponding one of the odd-numbered reset lines R1, R3, . . . , Rn/2−1 while a source electrode thereof is connected to the first node N1. A drain electrode of the third transistor T3 is connected to the low-level power supply VSS. At these pixels P[4i+1,4j+3], an anode of the OLED is connected to the corresponding one of the even-numbered power voltage supply lines S2, S4, . . . , Sm/2.

At the pixels P[4i+1,4j+4] arranged at the (4i+1)th column and the (4j+4)th row, a gate electrode of the first transistor T1 is connected to the (4i+1)th gate lines G1, G5, . . . , Gn−3 while a source electrode thereof is connected to the (4j+4)th data lines D4, D8, . . . , Dm. Further, a drain electrode of the first transistor T1 is connected to the first node N1. At these pixels P[4i+1,4j+4], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+1,4j+4], a gate electrode of the third transistor T3 is connected to the corresponding one of the odd-numbered reset lines R1, R3, . . . , Rn/2−1 while a source electrode thereof is connected to the first node N1. A drain electrode of the third transistor T3 is connected to the low-level power supply VSS. At these pixels P[4i+1,4j+4], an anode of the OLED is connected to the corresponding one of the even-numbered power voltage supply lines S2, S4, . . . , Sm/2.

At the pixels P[4i+2,4j+1] arranged at the (4i+2)th column and the (4j+1)th row, a gate electrode of the first transistor T1 is connected to the (4i+2)th gate lines G2, G6, . . . , Gn−2 while a source electrode thereof is connected to the (4j+1)th data lines D1, D5, . . . , Dm−3. Further, a drain electrode of the first transistor T1 is connected to the first node N1. At these pixels P[4i+2,4j+1], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+2,4j+1], a gate electrode of the third transistor T3 is connected to the corresponding one of the odd-numbered reset lines R1, R3, . . . , Rn/2−1 while a source electrode thereof is connected to the first node N1. A drain electrode of the third transistor T3 is connected to the low-level power supply VSS. At these pixels P[4i+2,4j+1], an anode of the OLED is connected to the corresponding one of the odd-numbered power voltage supply lines S1, S3, . . . , Sm/2−1.

At the pixels P[4i+3,4j+1] arranged at the (4i+3)th column and the (4j+1)th row, a gate electrode of the first transistor T1 is connected to the (4i+3)th gate lines G3, G7, . . . , Gn−1 while a source electrode thereof is connected to the (4j+1)th data lines D1, D5, . . . , Dm−3. Further, a drain electrode of the first transistor T1 is connected to the first node N1. At these pixels P[4i+3,4j+1], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+3,4j+1], a gate electrode of the third transistor T3 is connected to the corresponding one of the even-numbered reset lines R2, R4, . . . , Rn/2 while a source electrode thereof is connected to the first node N1. A drain electrode of the third transistor T3 is connected to the low-level power supply VSS. At these pixels P[4i+3,4j+1], an anode of the OLED is connected to the corresponding one of the odd-numbered power voltage supply lines S1, S3, . . . , Sm/2−1.

At the pixels P[4i+4,4j+1] arranged at the (4i+4)th column and the (4j+1)th row, a gate electrode of the first transistor T1 is connected to the (4i+4)th gate lines G4, G8, . . . , Gn while a source electrode thereof is connected to the (4j+1)th data lines D1, D5, . . . , Dm−3. Further, a drain electrode of the first transistor T1 is connected to the first node N1. At these pixels P[4i+4,4j+1], a gate electrode of the second transistor T2 is connected to the first node N1 while a source electrode thereof is connected to a cathode of the OLED. Further, a drain electrode of the second transistor T2 is connected to the low-level power supply VSS. At these pixels P[4i+4,4j+1], a gate electrode of the third transistor T3 is connected to the corresponding one of the even-numbered reset lines R2, R4, . . . , Rn/2 while a source electrode thereof is connected to the first node N1. A drain electrode of the third transistor T3 is connected to the low-level power supply VSS. At these pixels P[4i+4,4j+1], an anode of the OLED is connected to the corresponding one of the odd-numbered power voltage supply lines S1, S3, . . . , Sm/2−1.

At each pixel, the transistors T1 to T3 can be made from an amorphous silicon or a polycrystalline silicon, and can be implemented by N-type MOS transistors or other types.

As a result, two pixels adjacent horizontally to each other as shown in FIG. 6 share the same power voltage supply line (one of the lines S1 to Sm/2), whereas two pixels adjacent vertically to each other share the same reset line (one of the reset lines R1 to Rn/2).

Each OLED driving circuit 305, if the first transistor T1 is turned on in response to a scanning signal, then a data voltage from the jth data line Dj is supplied to the first node N1. The data voltage supplied to the first node N1 is applied to the gate electrode of the second transistor T2. When the second transistor T2 is turned on by the data voltage supplied in this manner, a current flows through the OLED. At this time, the current flowing through the OLED is generated by the high-level power supply voltage VDD, and an amount of the generated current is in proportion to a magnitude of the data voltage applied to the gate electrode of the second transistor T2. Further, even when the first transistor T1 is turned off, the second transistor T2 is maintained at the turned-on state by a data voltage floated on the first node N1. Subsequently, the third transistor T3 is turned on by a reset signal, so that the second transistor T2 is maintained at the turned-on state until the first node N1 is discharged.

The OLED driving circuit 305 discharges a control node (i.e., first node) of the OLED driving device (i.e., second transistor) every constant period to reduce a deterioration caused by a gate-bias stress of the OLED driving device and hence prevent a characteristic change caused by a deterioration of the OLED driving device, thereby assuring reliability for the operation of the OLED driving circuit 305.

Figure 7:
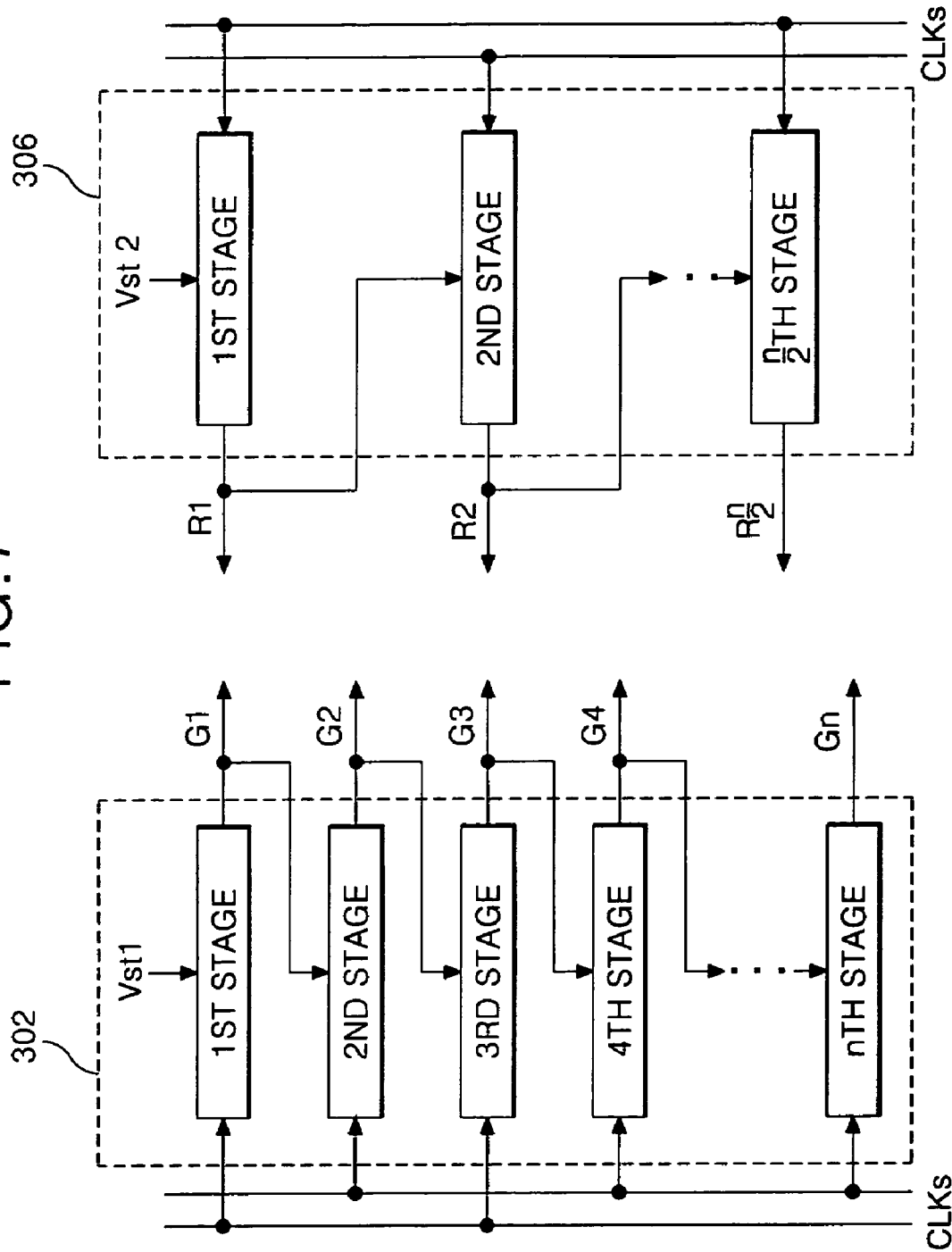
FIG. 7 is a schematic block diagram of an example of the gate driving circuit and the reset driving circuit shown in FIG. 6.

FIG. 7 schematically shows an example of the gate driving circuit 302 and the reset driving circuit 306 of FIG. 6.

Referring to FIG. 7, the gate driving circuit 302 includes a shift register composed of n stages connected in cascade. In this shift register, a first start signal Vst1 is inputted to the 1st stage while an output signal at the previous stage is inputted to the 2nd to nth stages as a start signal. Each stage has the same circuit configuration, and shifts the start signal Vst1 or the output signal at the previous stage in response to a clock signal CLKs to generate a scanning pulse having a pulse width of one horizontal period. The scanning signal generated in this manner is sequentially applied to the gate lines G1 to Gn.

The reset driving circuit 306 includes a shift register composed of n/2 stages, each of which has the same circuit configuration as the shift register stage of the gate driving circuit 302. A clock signal CLKs supplied to the reset driving circuit 306 has twice larger period and twice larger duration time than the clock signal supplied to the gate driving circuit 302. Each reset signal generated at each stage of the reset driving circuit 306 simultaneously resets the pixels at two rows.

Meanwhile, as for a time difference between the scanning signal and the reset signal generated at the same column, the reset signal is delayed by approximately more than ½ frame interval in comparison to the scanning signal. In order to generate the reset signal more lately than the scanning signal, a time difference should be put between the first start signal Vst1 and the second start signal Vst2. Thus, the start pulse Vst2 supplied to the reset driving circuit 306 is generated more approximately ½ frame interval later than the start pulse Vst supplied to the gate driving circuit 305.

Such a reset signal may be supplied to the reset lines R1 to Rn/2 more than once every frame interval, or may be supplied to the reset lines R1 to Rn/2 for each several frame interval. Alternatively, if the reset lines R1 to Rn/2 are commonly connected, then the reset signal may be simultaneously supplied to all of the reset lines R1 to Rn/2.

Figure 8:
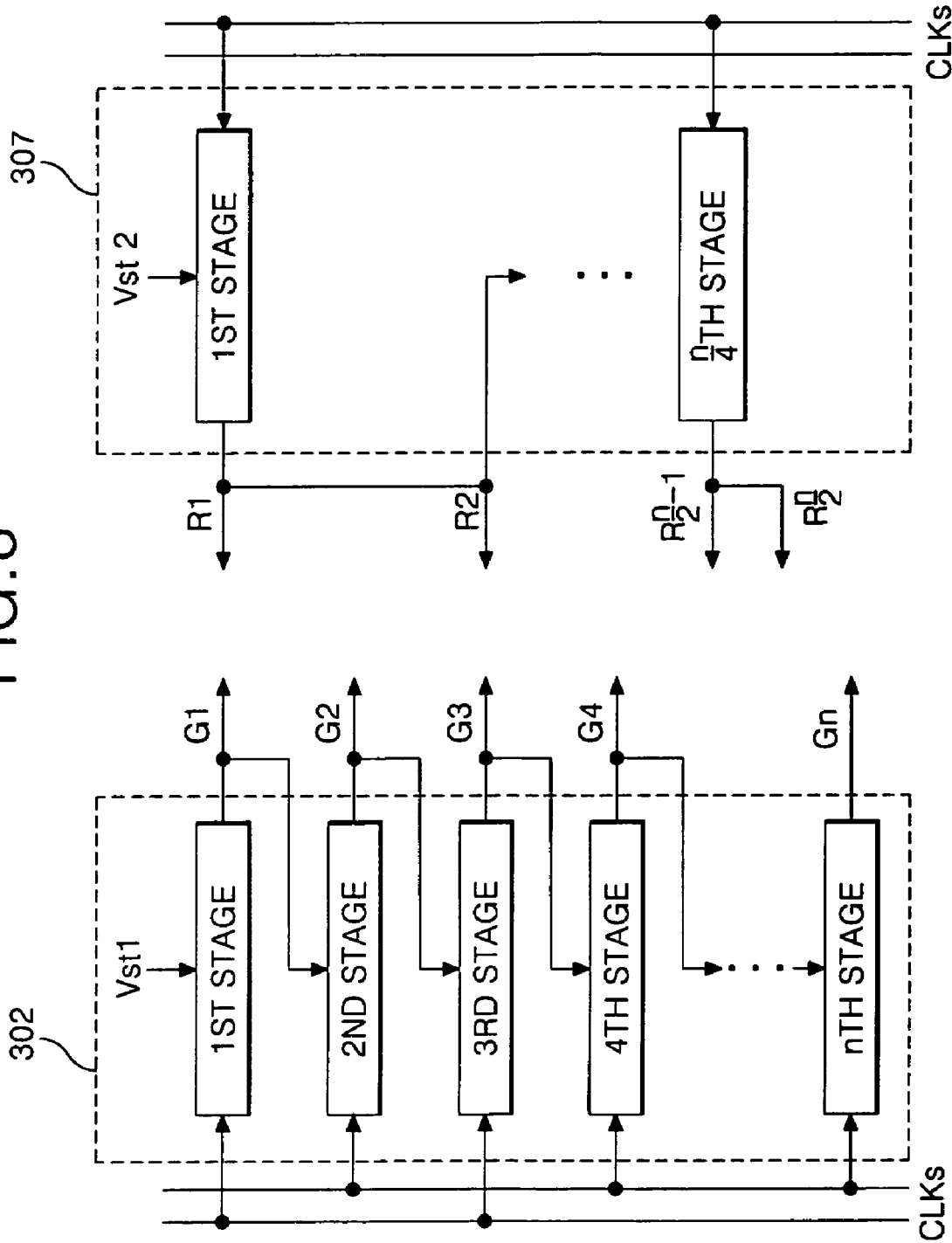
FIG. 8 is a schematic block diagram of another example of the gate driving circuit and the reset driving circuit shown in FIG. 6.

FIG. 8 shows another example of the reset driving circuit of FIG. 6. The reset driving circuit 307 can be applied to the reset driving circuit of FIG. 6.

Referring to FIG. 8, the reset driving circuit 307 includes n/4 stages connected in cascade. A reset signal generated at each stage is simultaneously supplied to two adjacent reset lines R1 to Rn/2. A clock signal CLKs for instructing an operation timing of such a stage has twice larger period and twice larger duration time than the clock signal CLKs supplied to the above-mentioned reset driving circuit 306 of FIG. 7. Alternatively, a method of simultaneously supplying a reset signal to three or more reset lines at one stage can be applied to the present OLED panels.

As described above, in the OLED display device according to the third embodiment of the present invention, two horizontally adjacent pixels of the OLED panel 303 share one same power voltage supply line supplied with the high-level power supply voltage to thereby reduce the number of power voltage supply lines in the OLED panel 303 to a half. Two vertically adjacent pixels thereof share one same reset line supplied with the reset signal to thereby reduce the number of reset lines in the OLED panel 303 to a half. Furthermore, the control node of the OLED driving device is discharged by the reset signal to thereby prevent a characteristic change caused by a deterioration of the OLED driving device and hence improve reliability for the operation of the OLED driving circuit 305.

Figure 9:
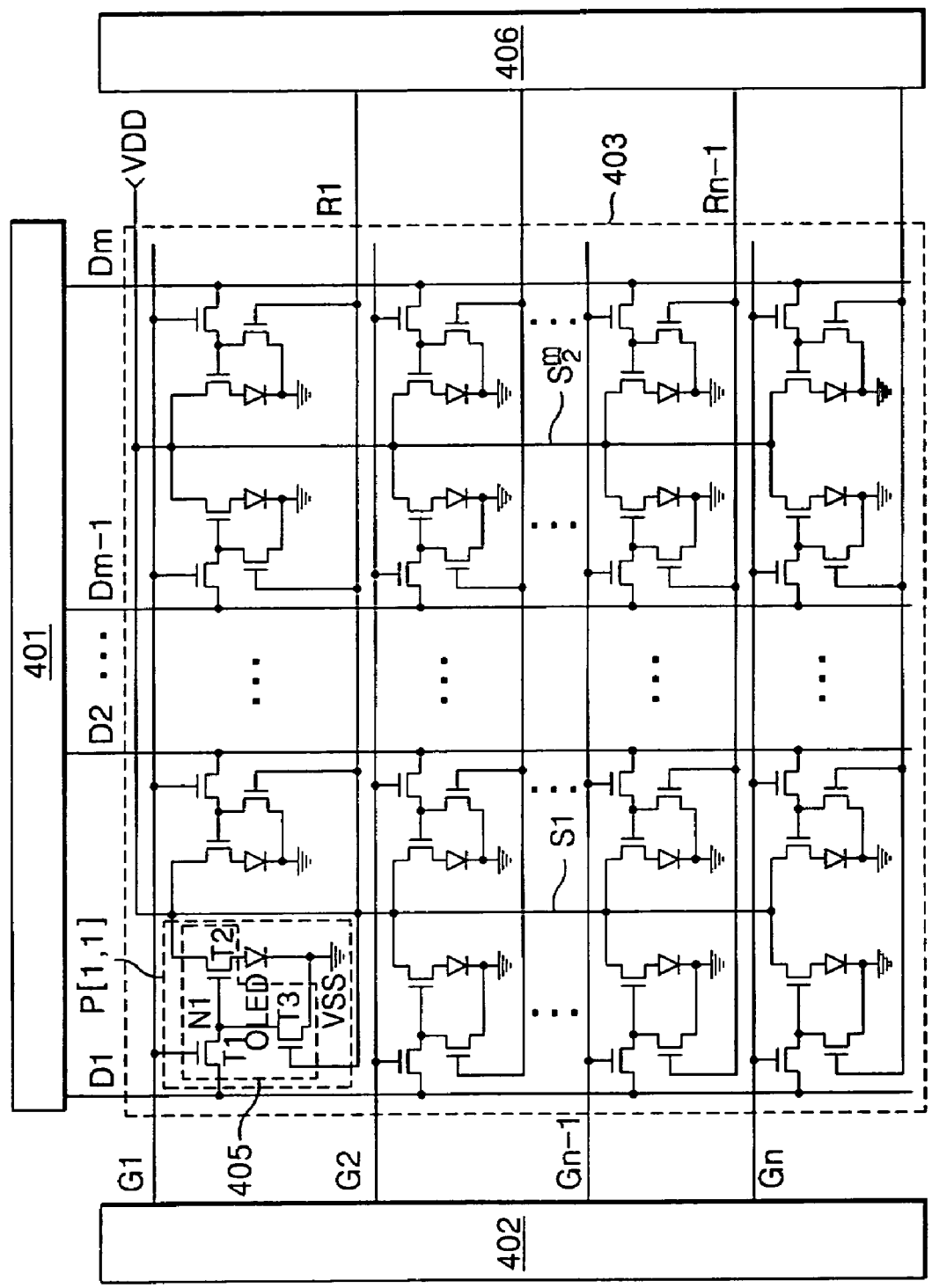
FIG. 9 is a schematic block circuit diagram showing a configuration of an organic light emitting diode display device having an organic light emitting diode driving circuit that is different from the organic light emitting diode driving circuit of FIG. 3 according to the present invention.
Figure 10:
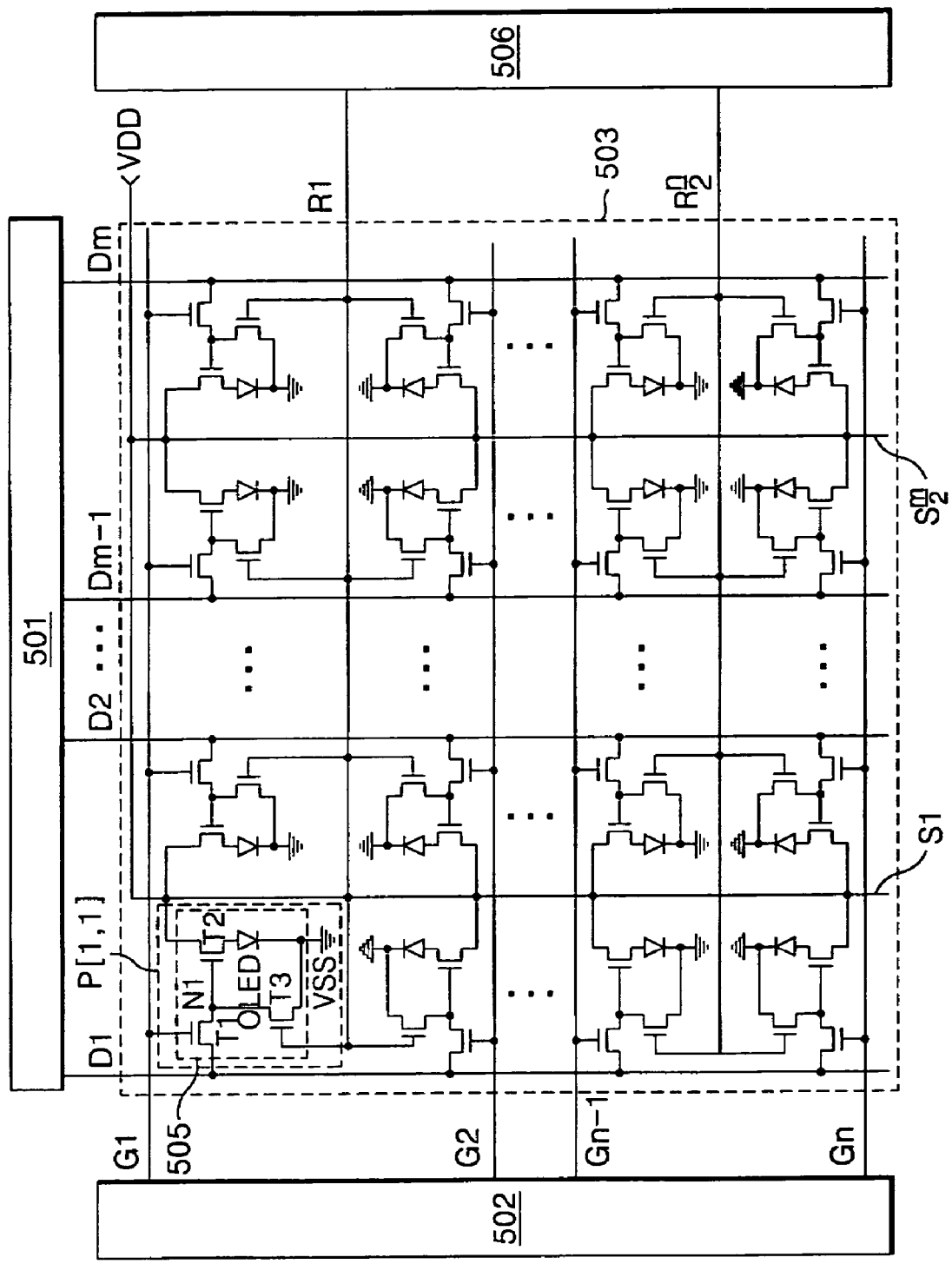
FIG. 10 is a schematic block circuit diagram showing a configuration of an organic light emitting diode display device having an organic light emitting diode driving circuit that is different from the organic light emitting diode driving circuit of FIG. 6 according to the present invention.

Meanwhile, the OLED driving circuits 101, 205 and 305 at each pixel P[i,j] in the first to third embodiments have been described above to have a configuration in which they are connected to the cathode of the corresponding OLED, but such a configuration is merely an example. As such, alternatively, as shown in FIG. 9 and FIG. 10, the OLED driving circuit may take a different configuration in which it is connected to the anode of the OLED. Herein, FIG. 9 illustrates an example of a configuration of the pixel P[i,j] with respect to the second embodiment (e.g., FIG. 3) while FIG. 10 illustrates an example of a configuration of the pixel P[i,j] with respect to the third embodiment (e.g., FIG. 6). In FIG. 9 and FIG. 10, reference numerals '401' and '501' represent data driving circuits; '402' and '502' are gate driving circuits; and '406' and '506' are reset driving circuits.

Figure 11:
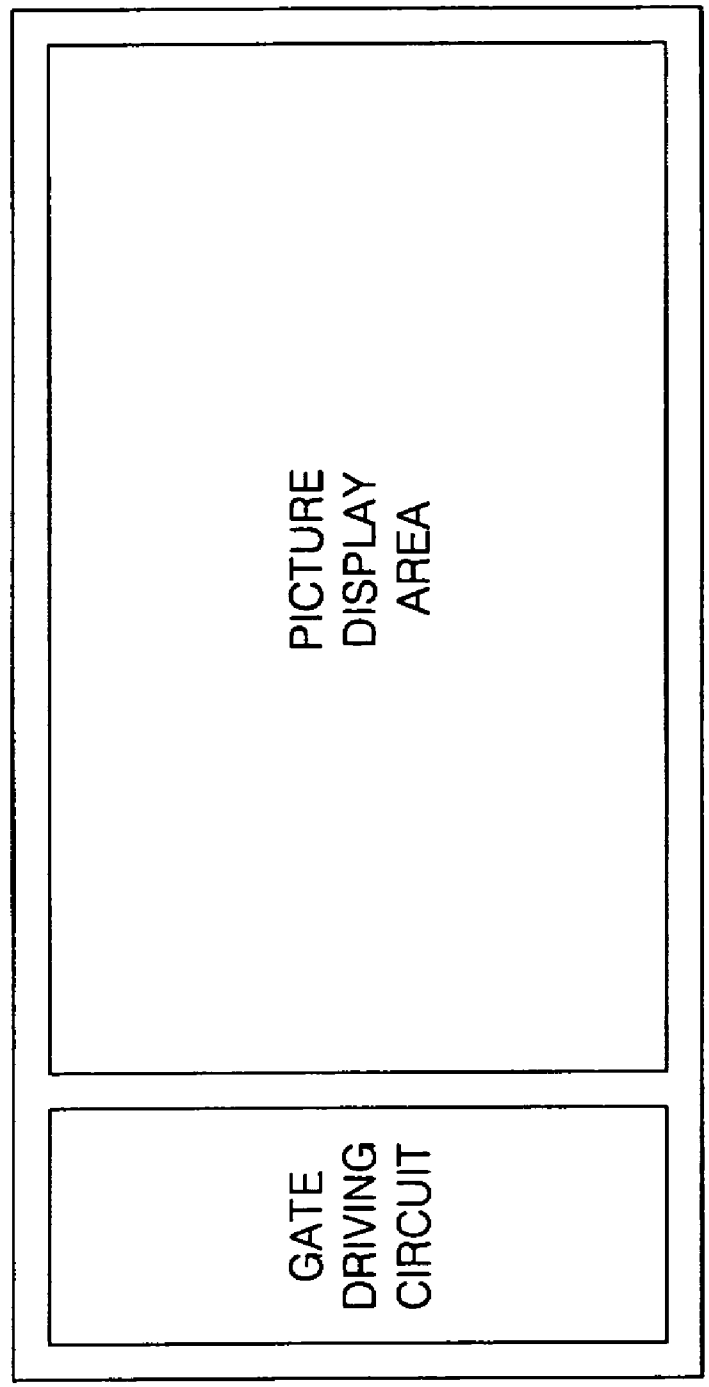
FIG. 11 depicts an example of the organic light emitting diode display device of FIG. 2A in which a driving circuit is built according to the present invention.
Figure 12:
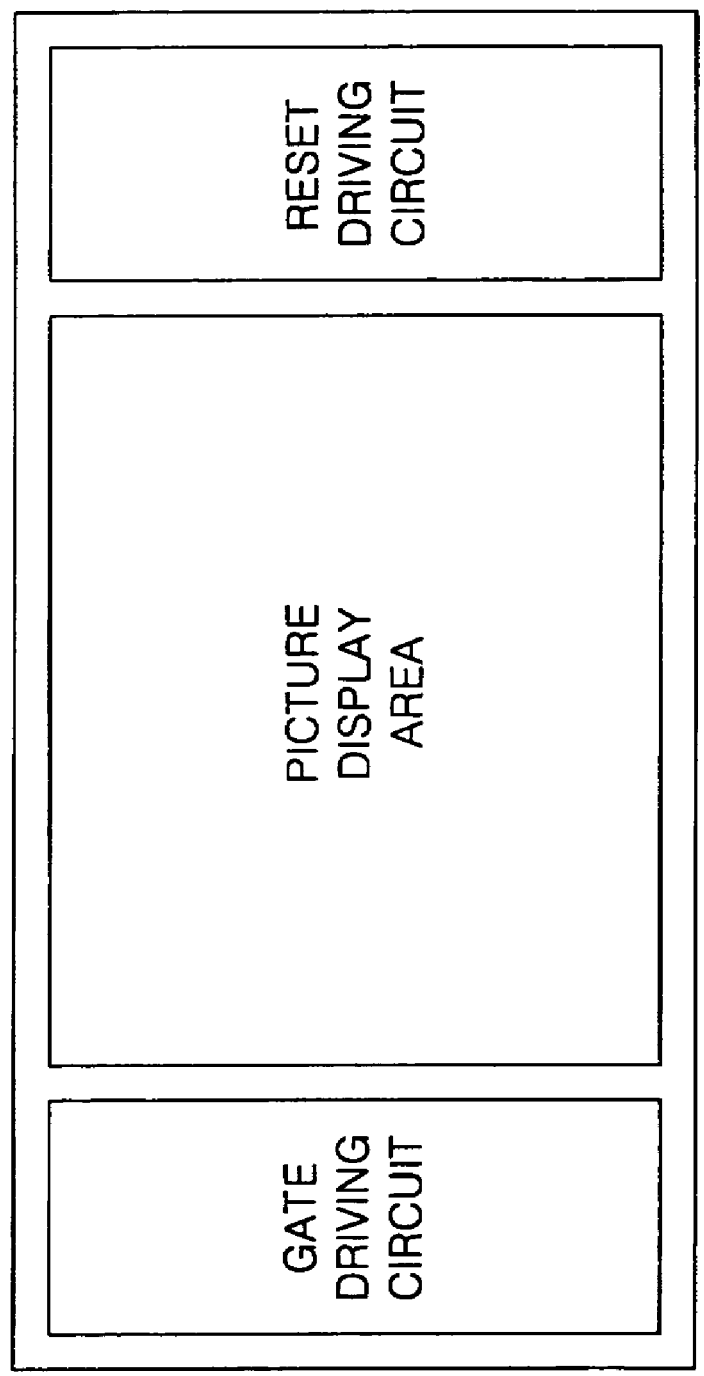
FIG. 12 depicts an example of the organic light emitting diode display device of FIG. 3, 6, 9 or 10 in which a driving circuit is built according to the present invention.

Moreover, the gate driving circuit in the first embodiment may be provided at the lower substrate of the OLED panel as shown in FIG. 11, and the gate driving circuit and the reset driving circuit in the second and third embodiments may be provided at the lower substrate of the OLED panel as shown in FIG. 12. Each transistor of the driving circuits provided within the OLED panel can be configured by a transistor employing an amorphous silicon or a polycrystalline silicon such as a thin film transistor TFT.

As described above, in the OLED display device according to the embodiments of the present invention, adjacent pixels can share the signal line to reduce the number of lines in the OLED panel as well as to increase the aperture ratio of the OLED panel, thereby improving brightness. Furthermore, a characteristic change caused by a deterioration of the OLED driving device can be prevented to improve reliability for the operation of the OLED driving circuit.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. An organic light emitting diode display device, comprising:

first and second data lines;
a power voltage supply line supplied with a power supply voltage;
first and second gate lines crossing the first data line, the second data line and the power voltage supply line;
first, second, third and fourth organic light emitting diodes commonly connected to the power voltage supply line;
a first organic light emitting diode driving circuit configured to drive the first organic light emitting diode with a data voltage from the first data line in response to a scanning signal from the first gate line;
a second organic light emitting diode driving circuit configured to drive the second organic light emitting diode with a data voltage from the second data line in response to the scanning signal from the first gate line;
a third organic light emitting diode driving circuit configured to drive the third organic light emitting diode with the data voltage from the first data line in response to a scanning signal from the second gate line;
a fourth organic light emitting diode driving circuit configured to drive the fourth organic light emitting diode with the data voltage from the second data line in response to the scanning signal from the second gate line; and
a reset line to apply a reset signal to the first, second, third and fourth organic light emitting diode driving circuits.

2. The organic light emitting diode display device according to claim 1, further comprising:

a gate driving circuit configured to supply the respective scanning signals to the first and second gate lines; and a data driving circuit configured to supply the respective data voltages to each of the data lines.

3. The organic light emitting diode display device according to claim 2, wherein the gate driving circuit is formed on a substrate provided with the first and second data lines, the power voltage supply line, the first and second gate lines, the first and second organic light emitting diodes, and the first and second organic light emitting diode driving circuits.

4. The organic light emitting diode display device according to claim 1, wherein the first organic light emitting diode driving circuit includes:
a first transistor configured to supply the data voltage from the first data line to a first node in response to the scanning signal from the first gate line;
a second transistor configured to control an amount of current amount flowing through the first organic light emitting diode by a voltage at the first node; and
a first storage capacitor configured to charge the voltage at the first node.

5. The organic light emitting diode display device according to claim 4, wherein the second organic light emitting diode driving circuit includes:
a third transistor configured to supply the data voltage from the second data line to a second node in response to the scanning signal from the first gate line;
a fourth transistor configured to control an amount of current flowing through the second organic light emitting diode by a voltage at the second node; and
a second storage capacitor configured to charge the voltage at the second node.

6. The organic light emitting diode display device according to claim 1, wherein two horizontally adjacent pixels are provided between the first and second data lines, a first one of the two pixels includes the first organic light emitting diode and the first organic light emitting diode driving circuit, and a second one of the two pixels includes the second organic light emitting diode and the second organic light emitting diode driving circuit.

7. The organic light emitting diode display device according to claim 1, wherein the first organic light emitting diode driving circuit includes:
a first transistor configured to supply the data voltage from the first data line to a first node in response to the scanning signal from the first gate line;
a second transistor configured to control an amount of current flowing through the first organic light emitting diode by a voltage at the first node; and
a third transistor configured to discharge the first node in response to the reset signal from the reset line.

8. The organic light emitting diode display device according to claim 7, wherein the second organic light emitting diode driving circuit includes:
a fourth transistor configured to supply the data voltage from the second data line to a second node in response to the scanning signal from the first gate line;
a fifth transistor configured to supply an amount of current flowing through the second organic light emitting diode by a voltage at the second node; and
a sixth transistor configured to discharge the second node in response to the reset signal from the reset line.

9. The organic light emitting diode display device according to claim 1, further comprising:
a reset driving circuit configured to generate the reset signal by more than ½ frame interval later in comparison to the scanning signal.

10. The organic light emitting diode display device according to claim 9, wherein the gate driving circuit and the reset driving circuit are formed on a substrate provided with the first and second data lines, the first and second gate line, the power voltage supply line, the reset line, the first, second, third and fourth organic light emitting diodes, and the first, second, third and fourth organic light emitting diode driving circuits.

11. An organic light emitting diode display device, comprising:
m data lines, wherein m is an integer;
n gate lines crossing the data lines, wherein n is an integer;
a plurality of power voltage supply lines supplied with a power supply voltage and arranged in parallel to the data lines between the data lines;
a plurality of reset lines provided between the gate lines; and
a first pixel including a first organic emitting diode, a second pixel including a second organic emitting diode, a third pixel including a third organic emitting diode and a fourth pixel including a fourth organic emitting diode,
wherein the first, second, third and fourth organic light emitting diodes are commonly connected to the same one of the power voltage supply lines,
the first to fourth pixels are simultaneously initialized by a same reset signal applied from the same one of the reset lines, and
two of the first through fourth organic light emitting diodes are horizontally adjacent to each other.

12. The organic light emitting diode display device according to claim 11, wherein the first pixel includes the first organic light emitting diode, and a first organic light emitting diode driving circuit configured to drive the first organic light emitting diode with a data voltage from one of the odd-numbered data lines in response to a scanning signal from one of the odd-numbered gate lines, the first organic light emitting diode driving circuit being initialized in response to a reset signal from one of the reset lines; and
the second pixel includes the second organic light emitting diode, and a second organic light emitting diode driving circuit configured to drive the second organic light emitting diode with a data voltage from one of the even-numbered data lines in response to the scanning signal from the one of the odd-numbered gate lines, the second organic light emitting diode driving circuit being initialized in response to a reset signal from one of the reset lines.

13. The organic light emitting diode display device according to claim 12, wherein the third pixel includes the third organic light emitting diode, and a third organic light emitting diode driving circuit configured to drive the third organic light emitting diode with the data voltage from the one of the odd-numbered data lines in response to a scanning signal from one of the even-numbered gate lines, the third organic light emitting diode driving circuit being initialized in response to a reset signal from one of the reset lines; and
the fourth pixel includes the fourth organic light emitting diode, and a fourth organic light emitting diode driving circuit configured to drive the fourth organic light emitting diode with the data voltage from the one of the even-numbered data lines in response to the scanning signal from the one of the even-numbered gate lines, the second organic light emitting diode driving circuit being initialized in response to a reset signal from one of the reset lines.

14. The organic light emitting diode display device according to claim 13, wherein the first organic light emitting diode driving circuit includes:
- a first transistor configured to supply the data voltage from the one of the odd-numbered data lines to a first node in response to the scanning signal from the one of the odd-numbered gate lines;
- a second transistor configured to control an amount of current flowing through the first organic light emitting diode by a voltage at the first node; and
- a third transistor configured to discharge the first node in response to the reset signal.

15. The organic light emitting diode display device according to claim 14, wherein the second organic light emitting diode driving circuit includes:
- a fourth transistor configured to supply the data voltage from the one of the even-numbered data lines to a second node in response to the scanning signal from the one of the odd-numbered gate lines;
- a fifth transistor configured to supply an amount of current flowing through the second organic light emitting diode by a voltage at the second node; and
- a sixth transistor configured to discharge the second node in response to the reset signal.

16. The organic light emitting diode display device according to claim 15, wherein the third organic light emitting diode driving circuit includes:
- a seventh transistor configured to supply the data voltage from the one of the odd-numbered data lines to a third node in response to the scanning signal from the one of the even-numbered gate lines;
- an eighth transistor configured to control an amount of current flowing through the third organic light emitting diode by a voltage at the third node; and
- a ninth transistor configured to discharge the third node in response to the reset signal.

17. The organic light emitting diode display device according to claim 16, wherein the fourth organic light emitting diode driving circuit includes:
- a tenth transistor configured to supply the data voltage from the one of the even-numbered data lines to a fourth node in response to the scanning signal from the one of the even-numbered gate lines;
- an eleventh transistor configured to control an amount of current flowing through the fourth organic light emitting diode by a voltage at the fourth node; and
- a twelfth transistor configured to discharge the fourth node in response to the reset signal.

18. The organic light emitting diode display device according to claim 11, further comprising:
- a gate driving circuit configured to sequentially supply a scanning signal to the gate lines;
- a data driving circuit configured to supply a data voltage to each of the data lines; and
- a reset driving circuit configured to supply a reset signal to the reset lines.

19. The organic light emitting diode display device according to claim 18, wherein the gate driving circuit includes:
- a shift register configured to sequentially generate the scanning signal in response to a clock signal generated in accordance with a predetermined clock frequency, the reset signal being generated at a frequency of $1/c \times$ the clock frequency (wherein c is an integer) to be supplied simultaneously to the c reset lines.

20. The organic light emitting diode display device according to claim 18, wherein the reset driving circuit sequentially applies the reset signal to the reset lines.

21. The organic light emitting diode display device according to claim 18, wherein the gate driving circuit and the reset driving circuit are formed on a substrate provided with the data lines, the gate lines, the power voltage supply lines, the reset lines, the organic light emitting diodes and the organic light emitting diode driving circuits.

22. The organic light emitting diode display device according to claim 11, wherein there are m/2 power voltage supply lines and n/2 reset lines.

23. An organic light emitting diode display device comprising:
- first and second data lines adjacent to each other and configured to respectively supply first and second data signals;
- first and second gate lines adjacent to each other and configured to respectively supply first and second scanning signals, the first and second gate lines crossing the first and second data lines;
- first, second, third and fourth pixels provided at an area formed between the first and second data lines and the first and second gate lines;
- a single power voltage supply line disposed between the first and second data lines and configured to supply a voltage to light emitting diodes of the at least first and second pixels; and
- a single reset line disposed between the first and second gate lines and configured to supply a reset signal to the first, second, third and fourth pixels.

24. The organic light emitting diode display device according to claim 23, wherein the first and second pixels are horizontally adjacent to each other, and the third and fourth pixels are horizontally adjacent to each other.

25. The organic light emitting diode display device according to claim 24, further comprising:
- a single power voltage supply line disposed between the first and second data lines and configured to supply a voltage to light emitting diodes of the first, second, third and fourth pixels.

* * * * *